United States Patent
Xu et al.

(10) Patent No.: US 11,469,975 B2
(45) Date of Patent: Oct. 11, 2022

(54) FILTER DEBUGGING METHOD, DEVICE, ELECTRONIC APPARATUS AND READABLE STORAGE MEDIUM

(71) Applicant: Beijing Baidu Netcom Science and Technology Co., Ltd., Beijing (CN)

(72) Inventors: Ming Xu, Beijing (CN); Xin Xie, Beijing (CN); Ying Liu, Beijing (CN); Yuezhen Qi, Beijing (CN); Ruifeng Li, Beijing (CN); Lu Bai, Beijing (CN)

(73) Assignee: Beijing Baidu Netcom Science & Technology Co., Ltd, Beijing (CN)

( * ) Notice: Subject to any disclaimer, the term of this patent is extended or adjusted under 35 U.S.C. 154(b) by 0 days.

(21) Appl. No.: 17/207,571

(22) Filed: Mar. 19, 2021

(65) Prior Publication Data
US 2021/0211365 A1 Jul. 8, 2021

(30) Foreign Application Priority Data
Jun. 30, 2020 (CN) .......................... 202010624108.3

(51) Int. Cl.
*H04L 43/028* (2022.01)
*H04L 41/16* (2022.01)
*H04W 84/02* (2009.01)

(52) U.S. Cl.
CPC ............ *H04L 43/028* (2013.01); *H04L 41/16* (2013.01); *H04W 84/02* (2013.01)

(58) Field of Classification Search
CPC ....... H04L 43/028; H04L 41/16; H04W 84/02
See application file for complete search history.

(56) References Cited

U.S. PATENT DOCUMENTS

2018/0131069 A1* 5/2018 Brannon ............... H01P 1/201
2021/0117738 A1* 4/2021 Liu ....................... G06V 10/82

FOREIGN PATENT DOCUMENTS

| CN | 107238507 A | 10/2017 |
| CN | 108170922 A | 6/2018 |
| CN | 108375353 A | 8/2018 |

(Continued)

OTHER PUBLICATIONS

First Chinese Office Action issued from The State Intellectual Property Office of People's Republic of China on Apr. 6, 2021 to CN Application No. 202010624108.3, 16 pages.

(Continued)

*Primary Examiner* — Adnan M Mirza
(74) *Attorney, Agent, or Firm* — Hunton Andrews Kurth LLP

(57) ABSTRACT

A filter debugging method, a device, an electronic apparatus and a readable storage medium are provided. The filter debugging method includes: step S1: inputting a current hole parameter and a current index value of a filter into a policy network which is pre-trained; step S2: determining, by the policy network, a target hole to be polished of the filter, according to the current hole parameter and the current index value of the filter; step S3: controlling a mechanical arm to polish the target hole of the filter; and step S4: determining whether the filter is qualified according to an index value of the polished filter; in a case that the filter is qualified, ending a process including the steps S1 to S4; in a case that the filter is unqualified, performing the steps S1 to S4 circularly until the filter is qualified.

12 Claims, 4 Drawing Sheets

(56) References Cited

FOREIGN PATENT DOCUMENTS

| | | |
|---|---|---|
| CN | 109149025 A | 1/2019 |
| CN | 109249300 A | 1/2019 |
| CN | 110676553 A | 1/2020 |
| CN | 210443650 U | 5/2020 |
| CN | 111260134 A | 6/2020 |
| CN | 111274727 A | 6/2020 |
| CN | 111313136 A | 6/2020 |
| JP | 2005032154 A | 2/2005 |

OTHER PUBLICATIONS

Extended European Search Report, issued from the European Patent Office, to EP Application No. 21164469.5, dated Sep. 24, 2021, 9 pages.

* cited by examiner

FILTER DEBUGGING METHOD, DEVICE, ELECTRONIC APPARATUS AND READABLE STORAGE MEDIUM

CROSS REFERENCE OF RELATED APPLICATION

The present disclosure claims a priority of Chinese patent application No. 202010624108.3 filed on Jun. 30, 2020, which is incorporated herein by reference in its entirety.

TECHNICAL FIELD

The present disclosure relates to reinforcement learning technologies, and in particular, to the field of filter intelligent debugging technologies, and in particular, to a filter debugging method, a device, an electronic apparatus and a readable storage medium.

BACKGROUND

With the advent of the 5G communication era, the demand of filters (such as ceramic dielectric filters) has rapidly increased, and in the production process of filters, in order to ensure the performance of the filters, each filter needs to be repeatedly debugged by skilled workers, which consumes a high labor cost and time cost, resulting in low filter debugging efficiency.

SUMMARY

A filter debugging method, a device, an electronic apparatus and a readable storage medium are provided in the present disclosure.

In a first aspect, a filter debugging method is provided in the present disclosure, including:

step S1: inputting a current hole parameter and a current index value of a filter into a policy network which is pre-trained;

step S2: determining, by the policy network, a target hole to be polished of the filter, according to the current hole parameter and the current index value of the filter;

step S3: controlling a mechanical arm to polish the target hole of the filter; and step S4: determining whether the filter is qualified according to an index value of the polished filter; in a case that the filter is qualified, ending a process including the steps S1 to S4; in a case that the filter is unqualified, performing the steps S1 to S4 circularly until the filter is qualified.

In a second aspect, a filter debugging device is provided in the present disclosure, including an inputting module, a controlling module, a determining module and a policy network which is pre-trained;

the inputting module is configured to input a current hole parameter and a current index value of a filter into a policy network which is pre-trained;

the policy network is configured to determine a target hole to be polished of the filter, according to the current hole parameter and the current index value of the filter;

the controlling module is configured to control a mechanical arm to polish the target hole of the filter; and the determining module is configured to: determine whether the filter is qualified according to an index value of the polished filter; in a case that the filter is qualified, end a determination of whether the filter is qualified; in a case that the filter is unqualified, trigger the inputting module, the controlling module and the policy network until the filter is qualified.

In a third aspect, an electronic device is provided in the present disclosure, including:

at least one processor; and a memory communicatively coupled to the at least one processor, where the memory stores instructions executable by the at least one processor, and the at least one processor executes the instructions to perform the filter debugging method in the first aspect.

In a fourth aspect, a non-transitory computer readable storage medium storing a computer instruction is provided in the present disclosure, where a computer executes the computer instruction to perform the filter debugging method in the first aspect.

According to the embodiments of the present disclosure, the policy network is trained in advance, so that the policy network can determine the debugging scheme of the filter according to the hole parameter and the index value of the filter, so an intelligent debugging of the filter is realized. According to the embodiments of the present disclosure, the reinforcement learning technology is applied to train the policy network and is applied to the field of filter debugging, so that the intelligent debugging of the filter is realized, the manual debugging of the filter is replaced, thereby improving the debugging efficiency of the filter.

It should be understood that the statements in this section are not intended to identify key or critical features of the embodiments of the present disclosure, nor are they intended to limit the scope of the present disclosure. Other features of the present disclosure will become apparent from the following description.

BRIEF DESCRIPTION OF THE DRAWINGS

The drawings are included to provide a better understanding of the present solution and are not to limit the present disclosure.

DETAILED DESCRIPTION

The following description of the exemplary embodiments of the present disclosure, taken in conjunction with the drawings, includes various details of the embodiments of the application to assist in understanding, which are to be considered exemplary only. Accordingly, those of ordinary skill in the art will recognize that various changes and modifications of the embodiments described herein can be made without departing from the scope of the present disclosure. In addition, descriptions of well-known functions and constructions are omitted in the following description for clarity and conciseness.

First Embodiment

Figure 1:
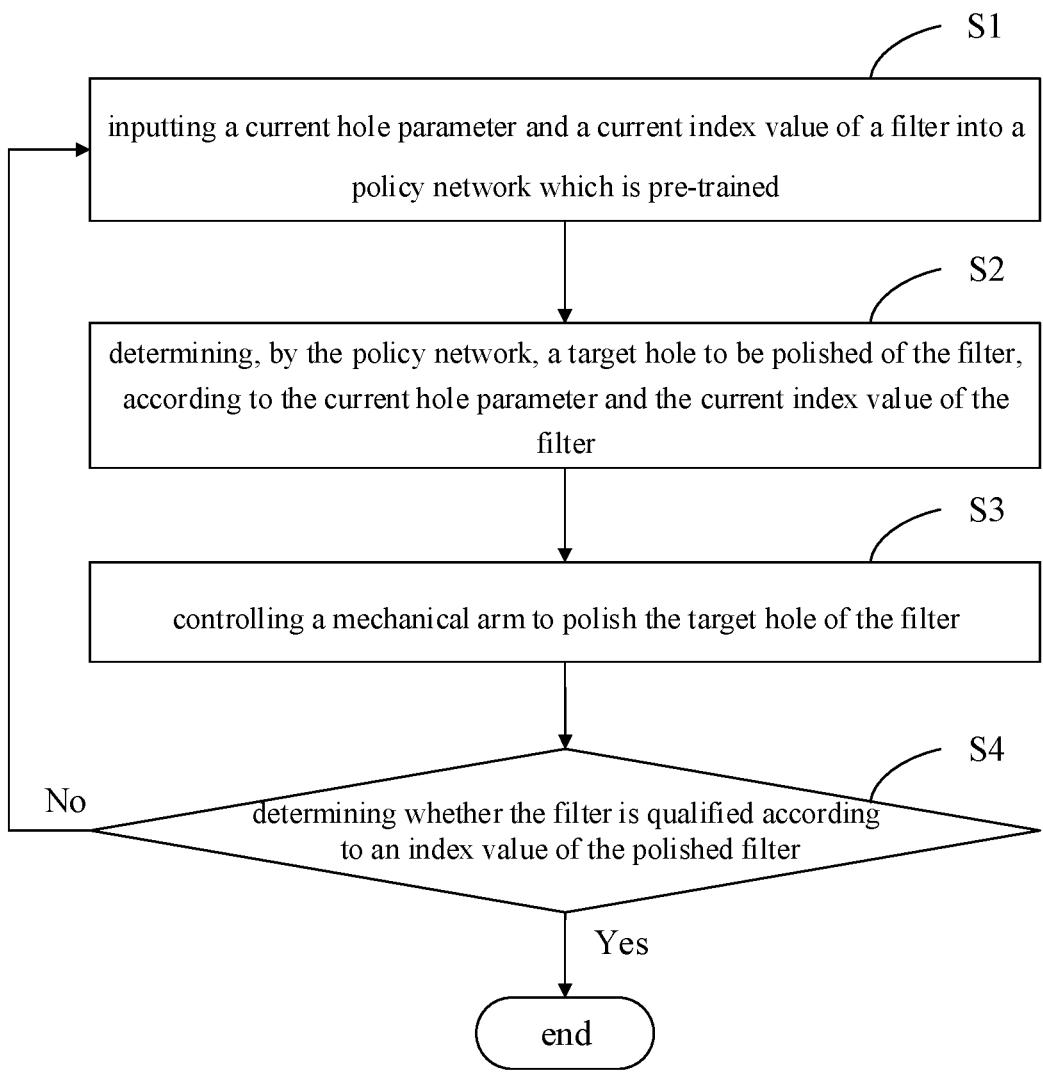
FIG. 1 is a schematic flowchart of a filter debugging method according to a first embodiment of the present disclosure.

As shown in FIG. 1, a filter debugging method is provided in an embodiment of the present disclosure, including:

step S1: inputting a current hole parameter and a current index value of a filter into a policy network which is pre-trained;

step S2: determining, by the policy network, a target hole to be polished of the filter, according to the current hole parameter and the current index value of the filter;

step S3: controlling a mechanical arm to polish the target hole of the filter; and step S4: determining whether the filter is qualified according to an index value of the polished filter; in a case that the filter is qualified, ending a process including the steps S1 to S4; in a case that the filter is unqualified, performing the steps S1 to S4 circularly until the filter is qualified.

In the embodiment of the present disclosure, the filter may include a ceramic dielectric filter, and may also include other filters. The hole parameter of the filter may include a hole depth and a hole diameter, and the index of the filter may include at least one of a center frequency, a pass-band width, a return loss, an insertion loss, a left-side out-of-band rejection, and a right-side out-of-band rejection. The index value of the filter is obtained by testing each index of the filter, namely the index value of the filter is the value of each index of the filter, and the index value of the filter may be obtained by a testing performed by an analysis instrument. Whether the filter is qualified depends on whether each index of the filter meets the requirement, and generally, when the six indexes meet the requirement, the filter is qualified. If one or more indexes of the filter do not meet the requirements, the filter is unqualified, and the hole parameter of the filter need to be adjusted until the filter is qualified.

In the embodiment of the present disclosure, the policy network may be obtained through a reinforcement learning training, and the policy network is configured to provide a filter debugging strategy according to the hole parameter and the index value of the filter. For the filter, the debugging strategy is specifically a hole polishing strategy, in other words, the policy network is configured to, determine which hole or holes are to be polished, according to the hole parameter and the index value of the filter.

In step S1, the current hole parameter and the current index value of the filter may be directly input into the policy network, so that in step S2, after the policy network receives the current hole parameter and the current index value of the filter, the current hole parameter and the current index value of the filter may be initially processed, and then a debugging policy is given, that is, a target hole to be polished of the filter is determined.

After the target hole is polished, the index values of the filter will change, so after step S3, the filter may be retested by an analysis instrument to obtain the index value of the polished filter, and whether the filter is qualified is determined according to the index value of the polished filter.

In the embodiment of the present disclosure, if the filter is qualified, the filter debugging process is ended; if the filter is not qualified, the filter debugging needs to be continued, specifically, the steps S1 to S4 are performed circularly until the filter is qualified.

According to the embodiments of the present disclosure, the policy network is trained in advance, so that the policy network can determine the debugging scheme of the filter according to the hole parameter and the index value of the filter, so an intelligent debugging of the filter is realized. According to the embodiments of the present disclosure, the reinforcement learning technology is applied to train the policy network and is applied to the field of filter debugging, so that the intelligent debugging of the filter is realized, the manual debugging of the filter is replaced, thereby improving the debugging efficiency of the filter.

In the present disclosure, step S1 may be implemented by directly inputting the current hole parameter and the current index value of the filter into the policy network, or may be implemented by processing the current hole parameter and the current index value of the filter and then inputting the processed hole parameter and index value into the policy network. For the latter, step S1 may include the following embodiments.

Optionally, the inputting the current hole parameter and the current index value of the filter into a policy network which is pre-trained includes:

performing a Multi-Layer Perceptron (MLP) processing on the current hole parameter of the filter to obtain a first parameter;

performing the MLP processing on the current index value of the filter to obtain a second parameter;

inputting the first parameter and the second parameter to the policy network which is pre-trained.

Correspondingly, the determining by the policy network the target hole to be polished of the filter according to the current hole parameter and the current index value of the filter includes:

determining, by the policy network, the target hole to be polished of the filter, according to the first parameter and the second parameter.

The MLP is also called an Artificial Neural Network (ANN), and besides the input and output layers, the MLP may have multiple hidden layers in between. The simplest MLP requires a hidden layer, i.e., a combination of an input layer, a hidden layer and an output layer can be referred to as a simple neural network. In the embodiment of the present disclosure, the policy network may also be an MLP.

In this embodiment, the MLP processing is performed on the current hole parameter (or index value) of the filter, and it is understood that the current hole parameter (or index value) of the filter is input to the MLP and the current hole parameter (or index value) of the filter is processed by the MLP. The current hole parameter and the index value of the filter can be processed by the same MLP, or can be processed by different MLPs respectively.

Further, before MLP processing is performed on the current hole parameter of the filter, a normalization processing may be performed on the current hole parameter of the filter. That is, after a normalization processing is performed on the current hole parameter of the filter, MLP processing is performed on the current hole parameter of the filter.

The normalization processing refers to normalizing the hole parameter to a number between 0 and 1, the formula $(X-X\_min)/(X\_max-X\_min)$ can be used.

Further, before the MLP processing is performed on the current index value of the filter, the following processing may be performed on the current index value of the filter: for the continuous index values, calculating a difference between the target index value and the real index value; for the discrete index values, the index values are encoded to be 0 or 1 (for example, in the above-described indexes of the filter, the index values corresponding to the center frequency, the pass band width and the return loss are continuous index values, and the index values corresponding to the insertion loss, the left-side out-of-band rejection and the right-side out-of-band rejection are discrete index values). That is, after the above-described processing is performed on the current index value of the filter, the MLP processing is performed on the current index value of the filter.

Figure 2:
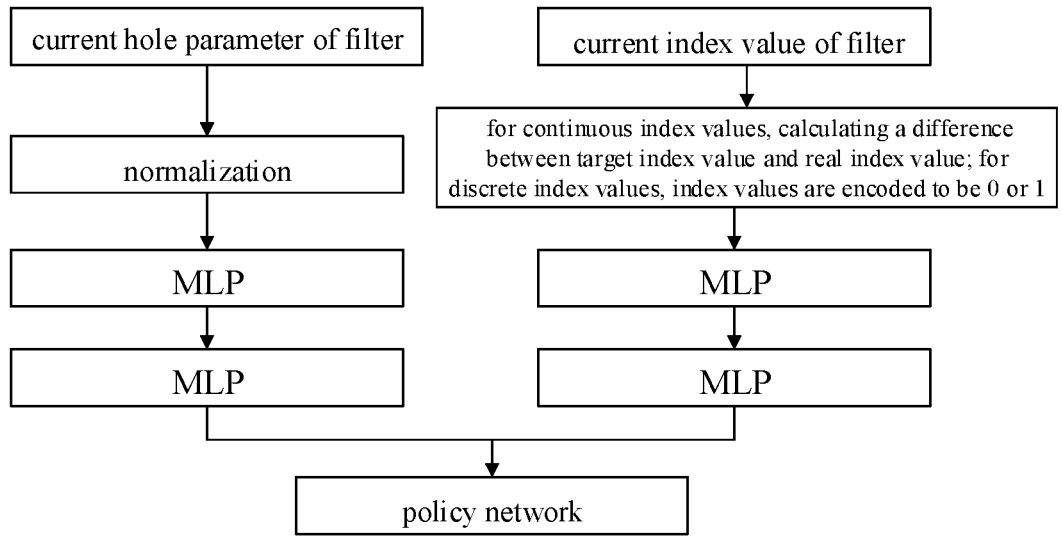
FIG. 2 is a schematic view of an input of a current hole parameter and a current index value of a filter into a policy network according to the first embodiment of the application.

FIG. 2 shows the above-described specific process of inputting the current hole parameter and index value of the filter into the policy network which is pre-trained.

In the embodiment, before the current hole parameter and the current index value of the filter are input into the policy network, the current hole parameter and the current index value are processed in advance, so that the processed data can be directly used by the policy network, and the policy network can more quickly provide the adjustment policy, so that it is able improve the processing efficiency of the policy network.

In the embodiment of the present disclosure, in order to avoid the situation that the filter is scrapped due to excessive hole polishing, in step S3, the mechanical arm may be controlled to controllably polish the target hole of the filter.

Optionally, where the controlling the mechanical arm to polish the target hole of the filter includes:

controlling the mechanical arm to polish the target hole of the filter, where the target hole of the filter is polished by one step at a time.

The target hole of the filter is polished by one step at a time, and a size of the step may be preset according to actual requirements.

Optionally, the policy network is obtained by training simulation data, the simulation data include a simulation hole parameter of a simulation filter and a simulation index value of the simulation filter.

The simulation data can be generated by a pre-established simulation model, so that the simulation model can be pre-established and a simulation environment can be established before the policy network is trained. The number of the simulation models may be one, or may be related to the number of the index items of the filter, for example, the number of the simulation models may be the same as the number of the index items of the filter. Thus, each index corresponds to a respective simulation model. For example, six different simulation models may be trained to fit the six indexes of center frequency, passband width, return loss, insertion loss, left side out-of-band rejection and right side out-of-band rejection. The simulation model can be trained by using algorithms such as an XGboost algorithm, a neural network algorithm and the like, which are not specifically described in the present disclosure.

The training of the policy network is realized through the simulation data, and the diversity and controllability of the training data can be ensured, so that the training effect of the policy network can be improved.

In the process of using simulation data to perform a reinforcement learning training on a policy network, a reinforcement learning environment needs to be built, and the state and action of the reinforcement learning environment are designed as follows: the state of the reinforcement learning environment is divided into two parts, one part is a simulation hole parameter (such as hole depth and hole diameter information) of the simulation filter, and the other part is simulation index value fitted by the simulation model.

The action of the reinforcement learning environment is to determine the hole to be polished of the simulation filter according to the state.

Figure 3:
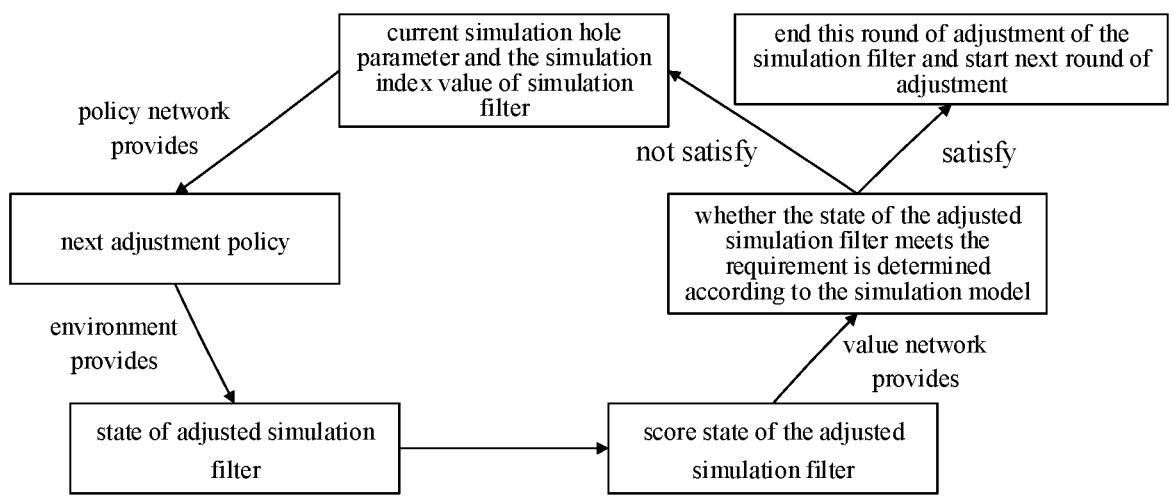
FIG. 3 is a schematic flow chart of a policy network reinforcement learning training according to the first embodiment of the present disclosure.

FIG. 3 shows a policy network reinforcement learning training flow chart. As shown in FIG. 3, the current simulation hole parameter and the simulation index value (i.e. the current state of the simulation filter) of the simulation filter are input into a policy network, and the policy network gives a next adjustment policy, the state of the adjusted simulation filter is given by the environment, the state of the adjusted simulation filter is scored by a value network, whether the state of the adjusted simulation filter meets the requirement is determined according to the simulation model, if so, the policy network ends the adjustment of the simulation filter, and starts the adjustment of the next round; if not, the policy network continues to perform a loop iteration on the adjustment.

Figure 4:
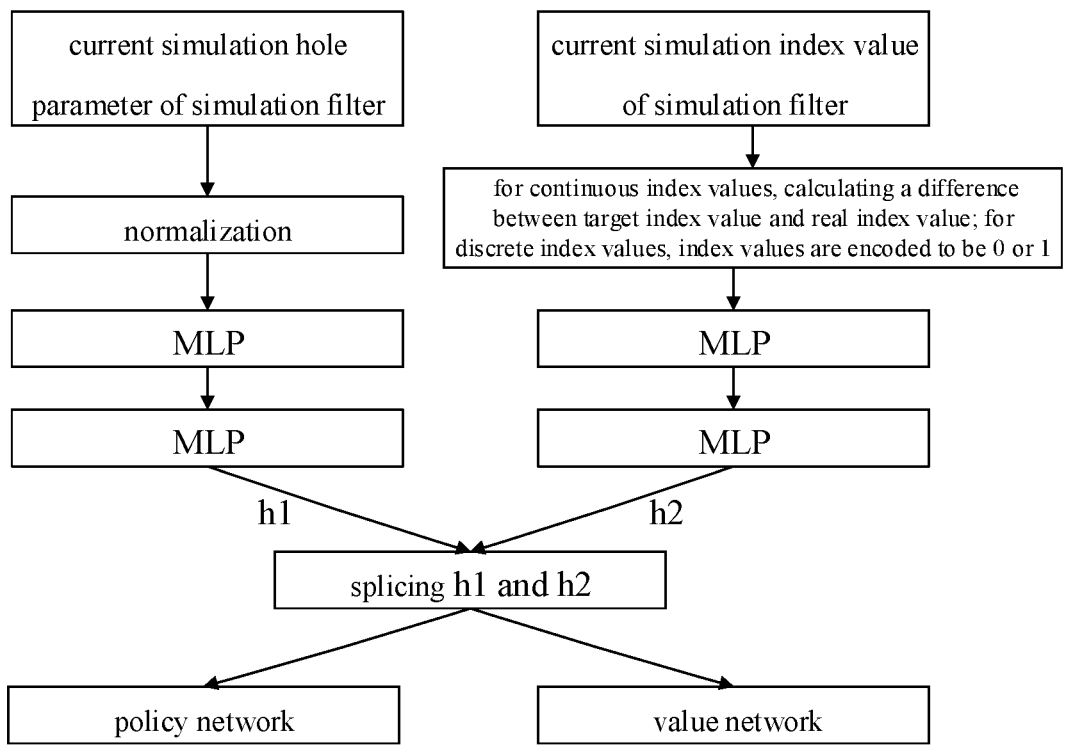
FIG. 4 is an architecture diagram of inputting a current simulation hole parameter and a current simulation index value of a simulation filter to a policy network and a value network according to the first embodiment of the present disclosure.

FIG. 4 is an architecture diagram of inputting a current simulation hole parameter and a current simulation index value of a simulation filter to a policy network and a value network according to the first embodiment of the present disclosure. As shown in FIG. 4, after a normalization processing is performed on the current simulation hole parameter of the simulation filter, the MLP processing is performed to obtain a first simulation parameter h1; after continuous or discrete processing is carried out on the current simulation index value of the simulation filter, the MLP processing is carried out to obtain a second simulation parameter h2; then h1 and h2 are spliced and input into the policy network and the value network respectively.

The h1 and h2 may be 128-dimensional vectors, for example, the dimension after h1 and h2 are spliced is 256 dimensions, the dimensions of the policy network and the value network may both be 256 dimensions, and the number of nodes of the MLP hidden layer may be 256.

Optionally, the policy network is trained by:

pre-training the policy network to obtain a pre-trained network, and changing a simulation hole parameter of one hole of the simulation filter each time in a pre-training process;

initializing parameters of the policy network to parameters of the pre-trained network; and updating the parameters of the policy network until a convergence.

In this embodiment, the parameters of the policy network may be updated using a gradient descent algorithm until the policy network and the value network converge.

In this embodiment, by pre-trained the policy network, the convergence rate of the policy network and the value network can be increased, thereby increasing the training efficiency of the policy network.

It should be noted that, in the present disclosure, various embodiments in the filter debugging method may be implemented in combination with each other, or may be implemented separately, and the present disclosure is not limited herein.

According to the embodiments of the present disclosure, the policy network is trained in advance, so that the policy network can determine the debugging scheme of the filter according to the hole parameter and the index value of the filter, so an intelligent debugging of the filter is realized. According to the embodiments of the present disclosure, the reinforcement learning technology is applied to train the policy network and is applied to the field of filter debugging, so that the intelligent debugging of the filter is realized, the manual debugging of the filter is replaced, thereby improving the debugging efficiency of the filter.

Second Embodiment

Figure 5:
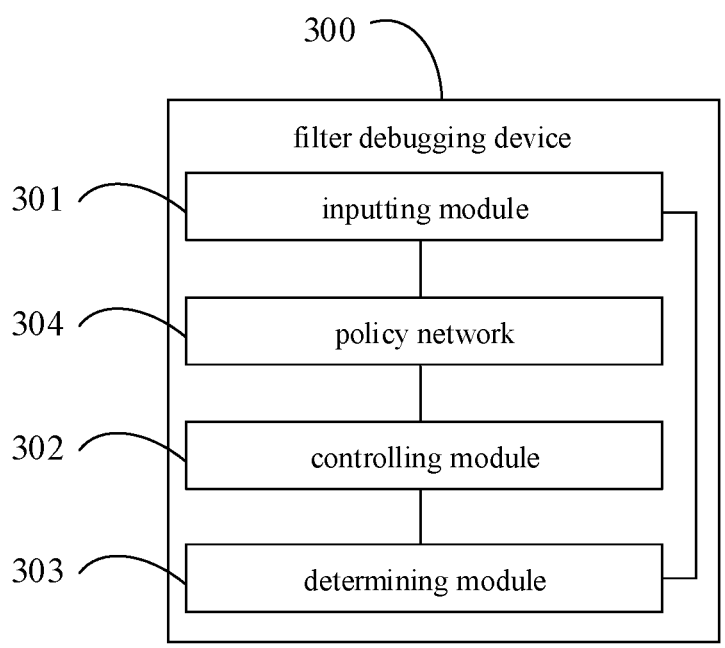
FIG. 5 is a schematic view of a filter debugging apparatus according to a second embodiment of the present disclosure.

As shown in FIG. 5, a filter debugging device 300 is further provided in an embodiment of the present disclosure, including an inputting module 301, a controlling module 302, a determining module 303 and a policy network 304 which is pre-trained;

the inputting module 301 is configured to input a current hole parameter and a current index value of a filter into a policy network which is pre-trained;

the policy network 304 is configured to determine a target hole to be polished of the filter, according to the current hole parameter and the current index value of the filter;

the controlling module 302 is configured to control a mechanical arm to polish the target hole of the filter; and the determining module 303 is configured to: determine whether the filter is qualified according to an index value of the polished filter; in a case that the filter is qualified, end a determination of whether the filter is qualified; in a case that the filter is unqualified, trigger the inputting module, the controlling module and the policy network until the filter is qualified.

Optionally, the inputting module 301 includes:

a first processing unit, configured to perform a Multi-Layer Perceptron (MLP) processing on the current hole parameter of the filter to obtain a first parameter;

a second processing unit, configured to perform the MLP processing on the current index value of the filter to obtain a second parameter;

an inputting unit, configured to input the first parameter and the second parameter to the policy network;

the policy network is further configured to:

determine the target hole to be polished of the filter, according to the first parameter and the second parameter.

Optionally, the controlling module 302 is further configured to:

control the mechanical arm to polish the target hole of the filter, where the target hole of the filter is polished by one step at a time.

Optionally, the hole parameter of the filter includes a hole depth and a hole diameter;

the index value of the filter includes at least one of a center frequency, a pass band width, a return loss, an insertion loss, a left side out-of-band rejection and a right side out-of-band rejection.

Optionally, the policy network 304 is obtained by training simulation data, the simulation data include a simulation hole parameter of a simulation filter and a simulation index value of the simulation filter.

Optionally, the policy network 304 is trained by:

pre-training the policy network to obtain a pre-trained network, and changing a simulation hole parameter of one hole of the simulation filter each time in a pre-training process;

initializing parameters of the policy network to parameters of the pre-trained network; and updating the parameters of the policy network until a convergence.

The filter debugging apparatus 300 provided in the present disclosure can implement each process in the above-described filter debugging method embodiments, and can achieve the same beneficial effects, and for avoiding repetition, the details are not repeated here.

An electronic apparatus and a readable storage medium are also provided in the embodiments of the present disclosure.

Figure 6:
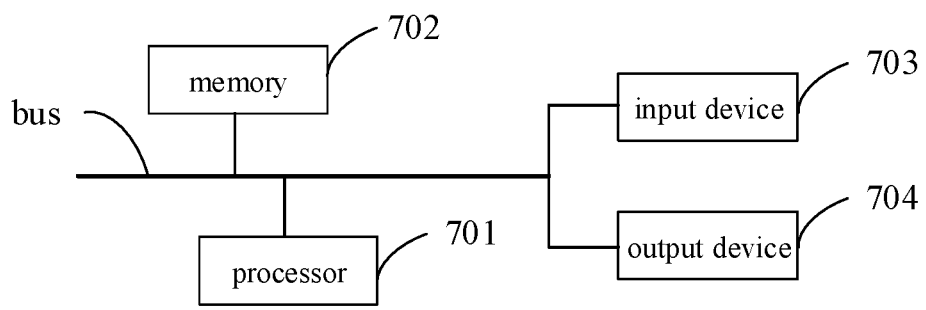
FIG. 6 is a block diagram of an electronic apparatus according to an embodiment of the present disclosure.

FIG. 6 is a block diagram of an electronic apparatus according to an embodiment of the method of the present disclosure. Electronic devices are intended to represent various forms of digital computers, such as laptops, desktops, workstations, personal digital assistants, servers, blade servers, mainframes, and other appropriate computers. Electronic devices may also represent various forms of mobile devices, such as personal digital processors, cellular telephones, smart phones, wearable devices, and other similar computing devices. The components shown herein, their connections and relationships, and their functions, are meant to be exemplary only, and are not meant to limit implementations of the applications described and/or claimed herein.

As shown in FIG. 6, the electronic apparatus includes: one or more processors 701, a memory 702, and interfaces for connecting the various components, including a high-speed interface and a low-speed interface. The various components are interconnected using different buses and may be mounted on a common motherboard or in other manners as desired. The processor may process instructions for execution within the electronic apparatus, including instructions stored in or on the memory to display graphical information of a GUI on an external input/output apparatus (such as a display device coupled to the interface). In other embodiments, multiple processors and/or multiple buses may be used, along with multiple memories and multiple memories, if desired. Also, multiple electronic apparatus may be connected, with each device providing some of the necessary operations (e.g., as an array of servers, a group of blade servers, or a multi-processor system). One processor 701 is illustrated in FIG. 6.

The memory 702 is a non-transitory computer readable storage medium as provided herein. Wherein the memory stores instructions executable by at least one processor to cause the at least one processor to perform the filter debugging method provided herein. The non-transitory computer readable storage medium of the present disclosure stores computer instructions for causing a computer to perform the filter debugging method provided by the present disclosure.

The memory 702, which is a non-transitory computer-readable storage medium, may be used to store non-transitory software programs, non-transitory computer-executable programs, and modules, such as program instructions/modules (e.g., the inputting module 301, the controlling module 302, the determination module 303, and the policy network 304 shown in FIG. 5) corresponding to the filter debugging method in the embodiments of the present disclosure. The processor 701 executes various functional applications of the problem analysis apparatus and data processing by running non-transitory software programs, instructions, and modules stored in the memory 702, that is, implements the filter debugging method in the above-described method embodiments.

The memory 702 may include a storage program area and a storage data area, where the storage program area may store an operating system, an application program required for at least one function; the storage data area may store data created by use of the electronic apparatus, and the like. Further, the memory 702 may include high-speed random access memory, and may also include non-transitory memory, such as at least one magnetic disk storage device, flash memory device, or other non-transitory solid state storage device. In some embodiments, the memory 702 may optionally include memory located remotely from the processor 701, which may be connected to the electronic apparatus via a network. Examples of such networks include, but are not limited to, the internet, intranets, local area networks, mobile communication networks, and combinations thereof.

The electronic apparatus may further include: an input device 703 and an output device 704. The processor 701, the memory 702, the input device 703 and the output device 704 may be connected by a bus or other means, as exemplified by the bus connection in FIG. 6.

The input device 703 may receive input numeric or character information and generate key signal inputs related to user settings and function control of the electronic apparatus, such as a touch screen, keypad, mouse, track pad, touch pad, pointer stick, one or more mouse buttons, track ball, joystick or other input device. The output devices 704 may include a display device, auxiliary lighting devices (e.g., LEDs), and tactile feedback devices (e.g., vibrating motors), among others. The display device may include, but is not limited to, a Liquid Crystal Display (LCD), a Light Emitting Diode (LED) display, and a plasma display. In some implementations, the display device can be a touch screen.

Various implementations of the systems and techniques described here can be realized in digital electronic circuitry, integrated circuitry, application specific ASICs (application specific integrated circuits), computer hardware, firmware, software, and/or combinations thereof. These various embodiments may include: implemented in one or more computer programs that are executable and/or interpretable on a programmable system including at least one programmable processor, which may be special or general purpose, receiving data and instructions from, and transmitting data and instructions to, a storage system, at least one input device, and at least one output device.

These computer programs (also known as programs, software applications, or code) include machine instructions for a programmable processor, and may be implemented using high-level procedural and/or object-oriented programming languages, and/or assembly/machine languages. As used herein, the terms "machine-readable medium" and "computer-readable medium" refer to any computer program product, apparatus, and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor.

To provide for interaction with a user, the systems and techniques described here can be implemented on a computer having: a display device (e.g., a CRT (cathode ray tube) or LCD (liquid crystal display) monitor) for displaying information to a user; and a keyboard and a pointing device (e.g., a mouse or a trackball) by which a user may provide input to the computer. Other kinds of devices may also be used to provide for interaction with a user; for example, feedback provided to the user can be any form of sensory feedback (e.g., visual feedback, auditory feedback, or tactile feedback); and input from the user can be received in any form, including acoustic, speech, or tactile input.

The systems and techniques described here can be implemented in a computing system that includes a back-end component (e.g., as a data server), or that includes a middleware component (e.g., an application server), or that includes a front-end component (e.g., a user computer having a graphical user interface or a web browser through which a user can interact with an implementation of the systems and techniques described here), or any combination of such back-end, middleware, or front-end components. The components of the system can be interconnected by any form or medium of digital data communication (e.g., a communication network). Examples of communication networks include: local Area Networks (LANs), Wide Area Networks (WANs), and the Internet.

The computer system may include clients and servers. The client and the server are generally remote from each other and typically interact through a communication network. The relationship of client and server arises by virtue of computer programs running on the respective computers and having a client-server relationship to each other. The server can be a cloud server, also called a cloud computing server or a cloud host, and is a host product in a cloud computing service system, so as to solve the defects of high management difficulty and weak service expansibility in the traditional physical host and Virtual Private Server (VPS) service.

According to the embodiments of the present disclosure, the policy network is trained in advance, so that the policy network can determine the debugging scheme of the filter according to the hole parameter and the index value of the filter, so an intelligent debugging of the filter is realized. According to the embodiments of the present disclosure, the reinforcement learning technology is applied to train the policy network and is applied to the field of filter debugging, so that the intelligent debugging of the filter is realized, the manual debugging of the filter is replaced, thereby improving the debugging efficiency of the filter.

It should be understood that various forms of the flows shown above, reordering, adding or deleting steps, may be used. For example, the steps described in the present disclosure may be executed in parallel, sequentially, or in different orders, and are not limited herein as long as the desired results of the technical solutions disclosed in the present disclosure can be achieved.

The above-described embodiments are not intended to limit the scope of the present disclosure. It should be understood by those skilled in the art that various modifications, combinations, sub-combinations and substitutions may be made, depending on design requirements and other factors. Any modification, equivalent replacement, and improvement made within the principle of the present disclosure shall be included in the scope of the present disclosure.

What is claimed is:

1. A filter debugging method, comprising:
  step S1: inputting a current hole parameter and a current index value of a filter into a policy network which is pre-trained;
  step S2: determining, by the policy network, a target hole to be polished of the filter, according to the current hole parameter and the current index value of the filter;
  step S3: controlling a mechanical arm to polish the target hole of the filter; and
  step S4: determining whether the filter is qualified according to an index value of the polished filter; in a case that the filter is qualified, ending a process including the steps S1 to S4;
  in a case that the filter is unqualified, performing the steps S1 to S4 circularly until the filter is qualified;
  wherein the inputting the current hole parameter and the current index value of the filter into the policy network which is pre-trained comprises:

performing a Multi-Layer Perceptron (MLP) processing on the current hole parameter of the filter to obtain a first parameter;

performing the MLP processing on the current index value of the filter to obtain a second parameter;

inputting the first parameter and the second parameter to the policy network which is pre-trained;

the determining by the policy network the target hole to be polished of the filter according to the current hole parameter and the current index value of the filter comprises:

determining, by the policy network, the target hole to be polished of the filter, according to the first parameter and the second parameter.

2. The method according to claim 1, wherein the controlling the mechanical arm to polish the target hole of the filter comprises:

controlling the mechanical arm to polish the target hole of the filter, wherein the target hole of the filter is polished by one step at a time.

3. The method according to claim 1, wherein the hole parameter of the filter comprises a hole depth and a hole diameter;

the index value of the filter comprises at least one of a center frequency, a pass band width, a return loss, an insertion loss, a left side out-of-band rejection and a right side out-of-band rejection.

4. The method according to claim 1, wherein the policy network is obtained by training simulation data, the simulation data comprise a simulation hole parameter of a simulation filter and a simulation index value of the simulation filter.

5. The method according to claim 4, wherein the policy network is trained by:

pre-training the policy network to obtain a pre-trained network, and changing a simulation hole parameter of one hole of the simulation filter each time in a pre-training process;

initializing parameters of the policy network to parameters of the pre-trained network; and updating the parameters of the policy network until a convergence.

6. A filter debugging device, comprising:

at least one processor;

a memory communicatively coupled to the at least one processor; and a policy network which is pre-trained, wherein the memory stores instructions executable by the at least one processor, and the at least one processor executes the instructions to:

input a current hole parameter and a current index value of a filter into a policy network which is pre-trained;

the policy network is configured to determine a target hole to be polished of the filter, according to the current hole parameter and the current index value of the filter;

the at least one processor executes the instructions to:

control a mechanical arm to polish the target hole of the filter; and determine whether the filter is qualified according to an index value of the polished filter; in a case that the filter is qualified, end a determination of whether the filter is qualified; in a case that the filter is unqualified, trigger the policy network until the filter is qualified, wherein the at least one processor executes the instructions to:

perform a Multi-Layer Perceptron (MLP) processing on the current hole parameter of the filter to obtain a first parameter;

perform the MLP processing on the current index value of the filter to obtain a second parameter;

input the first parameter and the second parameter to the policy network;

the policy network is further configured to:

determine the target hole to be polished of the filter, according to the first parameter and the second parameter.

7. The device according to claim 6, wherein the at least one processor executes the instructions to:

control the mechanical arm to polish the target hole of the filter, wherein the target hole of the filter is polished by one step at a time.

8. The device according to claim 6, wherein the hole parameter of the filter comprises a hole depth and a hole diameter;

the index value of the filter comprises at least one of a center frequency, a pass band width, a return loss, an insertion loss, a left side out-of-band rejection and a right side out-of-b and rejection.

9. The device according to claim 6, wherein the policy network is obtained by training simulation data, the simulation data comprise a simulation hole parameter of a simulation filter and a simulation index value of the simulation filter.

10. The device according to claim 9, wherein the policy network is trained by:

pre-training the policy network to obtain a pre-trained network, and changing a simulation hole parameter of one hole of the simulation filter each time in a pre-training process;

initializing parameters of the policy network to parameters of the pre-trained network; and updating the parameters of the policy network until a convergence.

11. An electronic apparatus, comprising:

at least one processor; and a memory communicatively coupled to the at least one processor, wherein the memory stores instructions executable by the at least one processor, and the at least one processor executes the instructions to perform the filter debugging method according to claim 1.

12. A non-transitory computer readable storage medium storing a computer instruction, wherein a computer executes the computer instruction to perform the filter debugging method according to claim 1.

* * * * *